(12) United States Patent
Kutkut et al.

(10) Patent No.: US 6,549,014 B1
(45) Date of Patent: Apr. 15, 2003

(54) BATTERY MONITORING METHOD AND APPARATUS

(75) Inventors: Nasser H. Kutkut, Madison, WI (US); David Brobst, Chico, CA (US)

(73) Assignee: Power Designers, LLC, Madison, WI (US)

( * ) Notice: Subject to any disclaimer, the term of this patent is extended or adjusted under 35 U.S.C. 154(b) by 0 days.

(21) Appl. No.: 10/077,679

(22) Filed: Feb. 15, 2002

(51) Int. Cl.[7] .............................................. G01N 27/416
(52) U.S. Cl. ....................................... 324/426; 320/132
(58) Field of Search ................................. 320/127, 128, 320/132, 135, 134, 136; 429/61, 90; 324/426, 429, 430, 432, 433, 434, 431

(56) References Cited

U.S. PATENT DOCUMENTS

| | | |
|---|---|---|
| 3,979,657 A | 9/1976 | Yorski |
| 4,316,185 A | 2/1982 | Watrous et al. |
| 4,387,334 A | 6/1983 | Loper |
| 4,929,931 A | 5/1990 | McCuen |
| 4,990,885 A | 2/1991 | Irick et al. |
| 5,095,274 A | 3/1992 | Brokaw |
| 5,130,659 A | 7/1992 | Sloan |
| 5,179,340 A | 1/1993 | Rogers |
| 5,394,089 A | 2/1995 | Clegg |
| 5,646,534 A | 7/1997 | Kopera |
| 5,808,469 A | 9/1998 | Kopera |
| 5,886,503 A | 3/1999 | McAndrews et al. |
| 5,895,440 A | 4/1999 | Proctor et al. |
| 6,037,749 A | 3/2000 | Parsonage |
| 6,118,384 A | 9/2000 | Sheldon et al. |
| 6,150,795 A | 11/2000 | Kutkut et al. |
| 6,222,370 B1 | 4/2001 | Schousek et al. |
| 6,268,710 B1 | 7/2001 | Koga |
| 6,304,062 B1 | 10/2001 | Batson |

*Primary Examiner*—Edward H. Tso
(74) *Attorney, Agent, or Firm*—Foley & Lardner

(57) ABSTRACT

Activity based battery monitoring is carried out with a minimal requirement for data memory capacity by determining events defined between changes in the battery states of charge, discharge and open circuit. Battery parameters are sampled at high sampling rates but only a relatively small number of memory data fields are stored in a non-volatile memory and updated after each event. In operation, battery current is monitored to determine a change in battery state. At the end of an event, at which time the battery changes state, a limited number of data fields, which nonetheless accurately categorizes the event, can be stored to the non-volatile memory, including the event type, the event start time, total ampere hours during the event, and various transient conditions during the event such as maximum voltage, current and temperature and minimum voltage, their times of occurrence, and any alarms that are triggered during the event.

23 Claims, 7 Drawing Sheets

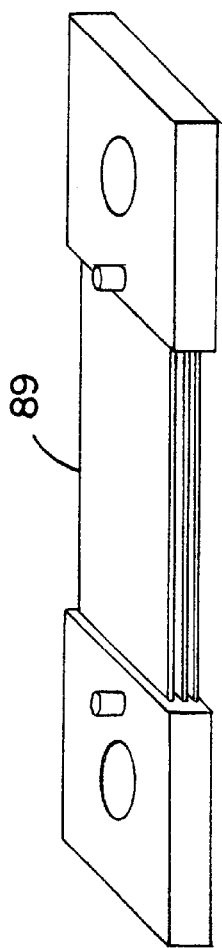
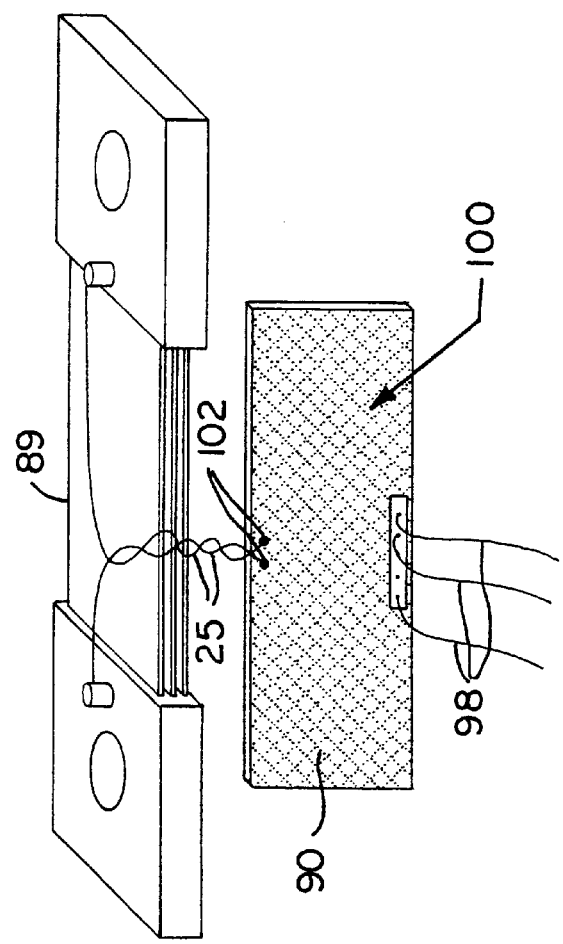

US 6,549,014 B1

BATTERY MONITORING METHOD AND APPARATUS

FIELD OF THE INVENTION

This invention pertains generally to the field of battery condition monitoring and management.

BACKGROUND OF THE INVENTION

Batteries and battery stacks are utilized in many applications such as telecommunication power supplies, electric vehicles, uninterruptible power supplies, and photovoltaic systems. In such systems, the battery or batteries either provide the main power supply for the system or back up a primary power supply. Although batteries are relied on to carry out these vital roles, they are a significant source of system failure because of the inevitably limited battery lifetime and reduced reliability as the battery ages. Because batteries are such a crucial factor in overall system reliability, many industrial and vehicle applications for batteries utilize continuous monitoring of the condition of the batteries to detect impending battery failure and to allow replacement or recharging of the battery before failure occurs.

Battery monitoring devices have been used to track and log battery performance parameters such as battery output voltage, current, temperature, state of charge, and remaining capacity. Low power battery packs, such as those used in portable devices, are often equipped with advanced monitoring and management systems to improve battery reliability and alert users to possible problems. However, systems of the type utilized for low power batteries are not generally suitable for heavy industrial battery applications as such monitoring systems tend to be relatively complex and costly, and generally require a relatively clean and controlled environment. There is thus a significant need for simple and cost effective battery monitoring systems for industrial battery applications.

Most of the present battery-monitoring devices incorporate real-time data acquisition systems that continually monitor the battery terminal conditions. Because of the large volume of real-time data obtained from the battery, the logged data is normally transmitted from the battery monitor to other larger devices, such as general purpose computers (e.g., PCs) or programmable logic controllers (PLCs). These devices are programmed to categorize and save the data as well as to alert users to potential problems. A large volume of data thus must be transferred from the battery monitor over a communications link to a PC or other device that is saving or analyzing the data. Such systems are not suitable for industrial battery applications, primarily because continuous real-time data logging requires a very large on-board data storage capability for the data monitors. On the other hand, continuous communication of the data generated by the monitor to a peripheral device is generally not feasible because of cost and the mode of battery use. For example, in motive power applications, the battery is on a mobile truck or vehicle, and a communications link with a stationary peripheral (e.g., a wireless communication link) is complex and expensive. In addition, due to the limited amount of on-board storage available, the rate at which data is sampled for storage is necessarily lower than would otherwise be desired. The decreased sampling rate impacts the quality of the logged data and its usefulness, as users can miss significant battery events (e.g., voltage and current spikes). Further considerations include the cost and size of monitors. Price and size constraints for mobile battery systems, in particular, limit the amount of allowable on-board memory, which is a significant component of the overall monitor volume and cost. The resulting compromises required for conventional battery monitoring thus result in the end users obtaining less data than desired, and the data that is acquired may not include significant short-term events.

SUMMARY OF THE INVENTION

The present invention carries out activity-based battery data-logging with only a minimal requirement for data memory capacity. Rather than recording every data point (e.g., voltage, current, temperature of the battery), the invention monitors battery activity in terms of charge, discharge, and open circuit events. Although battery parameters are preferably sampled at very high sampling rates, only a relatively small number of memory data fields are stored and updated. When the onset of an event is detected, i.e., a change of state to charge, discharge, or open circuit (no current flow), a new data record is created which is composed of a selected number of data fields. At every sampling instant, the data fields are preferably updated based on various decision criteria. When the event ends (a change of state occurs), the record for that event is closed, and a new record is initiated for the succeeding event. The entire event, which may last from a few seconds or fractions of a second to several hours, is summarized in a single record characterizing the battery activity during the entire event.

Battery monitoring apparatus in accordance with the invention includes a voltage sense input port, current sense input port and an output communications port through which data may be communicated. A programmable microcontroller is connected to the voltage sense and current sense input ports to receive signals therefrom and to the output communications port to at least transmit signals thereto, and is also connected to provide data to and from a non-volatile memory. The voltage sense input port is connected to leads which extend to a battery to sense the voltage across the battery, and the current sense input port is connected to leads extending to a current sensor which provides a signal representing the current through the battery. The microcontroller is programmed to monitor the signal from the current sense input port to detect a change in battery state between battery charging, discharging and open circuit. A battery event is defined between changes of state. During each event, the battery voltage and current is monitored and the microcontroller stores data to the non-volatile memory after an event which includes at least the time of the event and the total current over time as supplied from or to the battery during the event. At selective times, the microcontroller transfers data from the non-volatile memory through the output communications port to a computer for analysis and/or display to an operator. The apparatus may also include a temperature sense input port, connectable to a temperature sensor at the battery. The microcontroller receives a signal from the temperature sense input port during a battery event and stores data to the non-volatile memory after an event corresponding to one or more of the maximum temperature and minimum temperature occurring during the event.

In addition to data fields including the time of the event and the total current over time (amp-hours), the microcontroller may also store fields corresponding to the state of the event and the total current over time supplied to or from the battery, data fields corresponding to event alarms for overvoltage, current or temperature, maximum event voltage, maximum event voltage time, minimum event voltage, minimum event voltage time, maximum event temperature, maximum event temperature time, maximum event current, and maximum event current time. Although an event (a battery state between changes of state) may last for hours, only one data field record need be saved per event, greatly minimizing the memory requirements for the non-volatile memory while preserving the quality and relevance of the data that is saved. Furthermore, very fast sampling rates can be utilized to ensure that transient events such as maximum voltages and currents will be detected and the characteristics and timing of these events will be stored for later analysis.

The invention may also include a current sensor having a shunt connected in series with the battery through which flows the current flowing through the battery, an amplifier connected to receive the voltage across the shunt, a filter to low pass filter the signal from the amplifier, and an analog to digital converter to receive the filtered output signal from the amplifier and provide digital output data on a digital data communications link to the current sense input port, thereby providing a digital data signal to the monitoring apparatus to minimize noise in the signal. The current sensor can include a high gain amplifier and a low gain amplifier, each of which is connected to receive the voltage across the shunt, with the analog to digital converter including a first channel connected to receive the output from the high gain amplifier and a second channel to receive the output from the low gain amplifier. The microcontroller is programmed to selectively receive the current sense data from the first analog to digital converter channel when the current being sensed is below a threshold value and from the second analog to digital converter channel when the current being sensed is above a threshold value.

The microcontroller may also be programmed to store one or more data fields for each battery event to the non-volatile memory from other stationary data fields such as installation time, high voltage setpoint, low voltage setpoint, high current setpoint and high temperature setpoint, which can be compared to the data being read to trigger alarms, a cycle counter, total hours of open circuit overall events, total hours of discharge overall events, total hours of charge overall events, total amp-hours of discharge overall events, total amp-hours of charge overall events, and a count of the number of events recorded.

Further objects, features and advantages of the invention will be apparent from the following detailed description when taken in conjunction with the accompanying drawings.

BRIEF DESCRIPTION OF THE DRAWINGS

In the drawings:

FIG. 6 is a perspective view of a current shunt that may be utilized with a current sensor.

FIG. 7 is a perspective view of a current sensor circuit board mounted to the current shunt of FIG. 6.

DETAILED DESCRIPTION OF THE INVENTION

Figure 1:
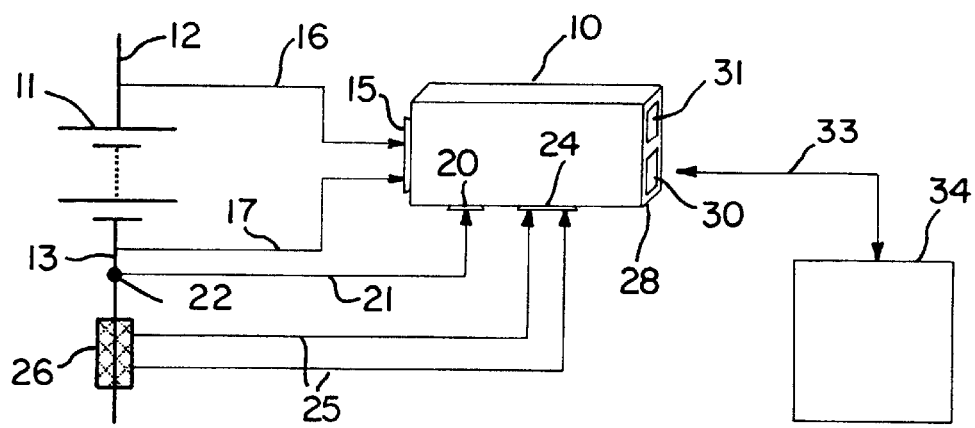
FIG. 1 is a block diagram of a battery monitoring system in accordance with the invention connected to monitor a battery.

With reference to the drawings, a battery monitoring apparatus in accordance with the invention is illustrated at 10 in FIG. 1 connected to monitor the conditions in a battery 11 connected at its positive and negative terminals to conductors 12 and 13, respectively. The battery monitor 10 in accordance with the invention has a voltage sense input port 15 which is connected by conducting lines 16 and 17 to the conductors 12 and 13 on either side of the battery to allow the voltage across the battery to be monitored. A temperature sense input port 20 is connected by a conducting lines 21 to receive a signal from a temperature sensor 22 which is connected to the battery 11. A current sense input port 24 is connected by conducting lines 25 to a current sensor 26 which is connected in one of the battery conductors (e.g., the conductor 13 as shown) to detect the level and direction of current flowing through the battery. The monitoring apparatus 10 has an output port 28 which may include a digital communications port 30 (e.g., an RS-232 port) and an infrared (IrDA) port 31. The data output port 30 may be connected via a communications link 33 to a remote system such as a computer 34, e.g., PC, for periodic communications to and from the battery monitoring apparatus 10. The IrDA port 31 allows communication to an IrDA device such as a Palm Pilot™, and other wired and wireless communication links may also be utilized as desired.

Figure 2:
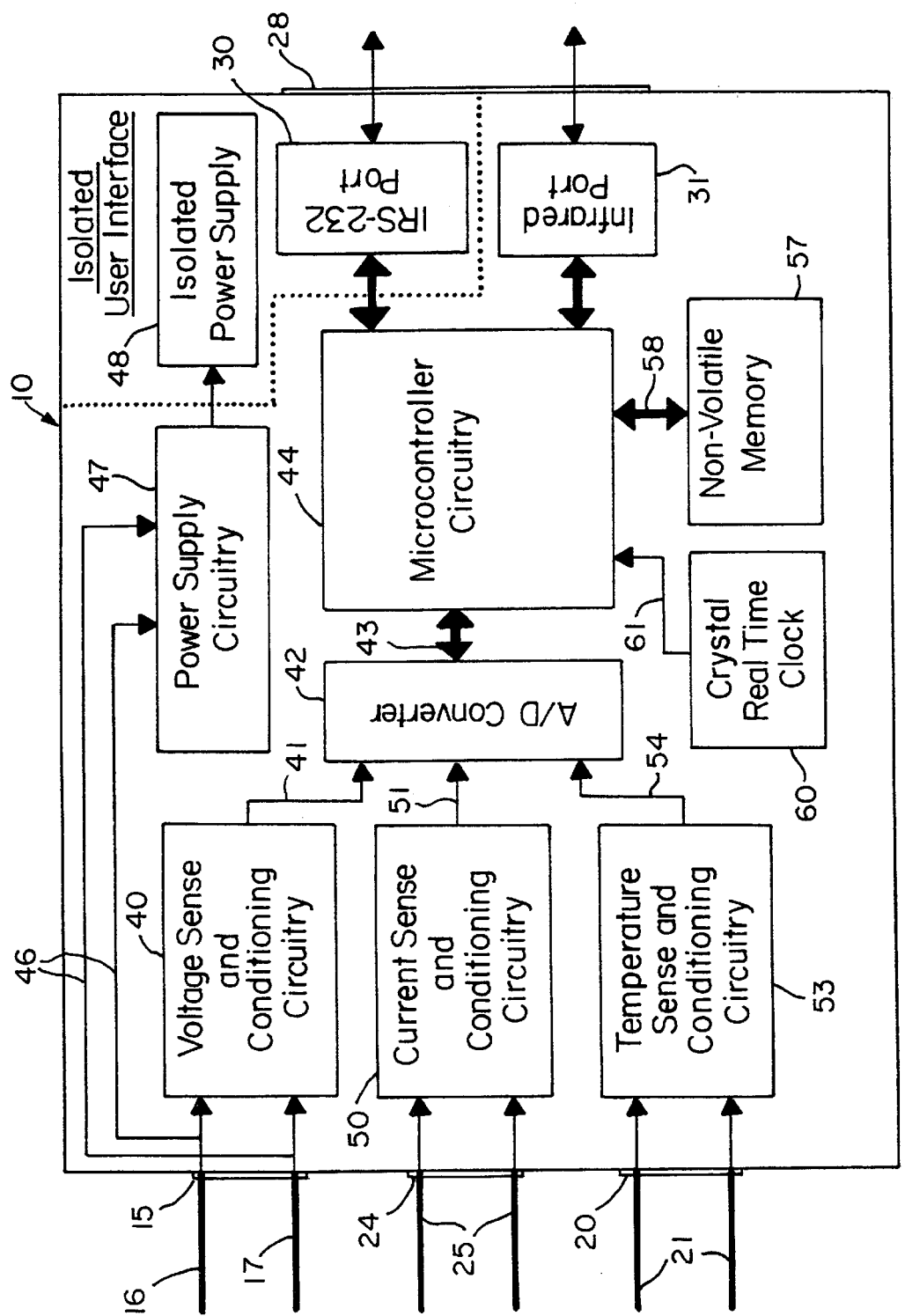
FIG. 2 is a block diagram of a battery monitor apparatus utilized in the system of FIG. 1.

FIG. 2 illustrates a block diagram of the battery monitoring apparatus 10, which may be enclosed in a separate case mounted adjacent to the battery. As illustrated in FIG. 2, the voltage across the battery provided on the conducting lines 16 and 17 to the input port 15 is supplied to a voltage sense and conditioning circuit 40 which provides a conditioned output signal on a line 41 to an analog to digital (A/D) converter 42. The output of the A/D converter 42 is supplied on digital data lines 43 to a micro-controller 44, e.g., a digital signal processor (DSP) chip. The voltage on the lines 16 and 17 is also transmitted by conducting leads 46 to a power supply circuit 47 to supply the internal power needs of the battery monitoring apparatus 10. The power supply circuit 47 preferably provides linear or switched regulated power through an isolation transformer to an isolated power supply 48 that provides the power required by the RS-232 port 30. The RS-232 port 30 must be isolated from the power supplied to the rest of the monitoring apparatus 10 to provide protection to users who may connect a computer directly to the apparatus 10 through the RS-232 port 30. The signal on the current sense lines 28 received at the current sense input port 24 is supplied to a current sense and conditioning circuit 50, the output of which is supplied on a line 51 to the A/D converter 42, and the temperature sense signal on the lines 17 is provided through the input port 20 to a temperature sense and condition circuit 53 which provides an output signal on a line 54 to the A/D converter 42. The A/D converter 42 supplies output data on the data lines 43 from the sense and conditioning circuits 40, 50 and 53 to the micro-controller 44 in a controlled manner. The sense and conditioning circuits 40, 50 and 53 are preferably formed of amplifier buffer front ends followed by low pass filtering circuits to filter out noise. A non-volatile memory 57 is connected by data lines 58 to the micro-controller 44. A suitable non-volatile memory 57 is an electrically erasable programmable read-only memory (EEPROM). The amount of memory required depends on the number of data points to be stored and the length of time during which data is to be maintained in the monitoring apparatus 10. A clock 60, e.g., a crystal oscillator, is utilized to generate a clock signal that is supplied on a line 61 to the micro-controller 44 to establish a time base. For purposes only of illustrating implementation of the invention, an exemplary sampling period of the A/D 42 for updating data is 200 msec. Examples of commercial components that may be utilized are: A/D 42, 12 bit, 4 channel Microchip MCP3204; micro-controller 44, Microchip flash micro-controller PIC 16LF76; non-volatile memory 57, EEPROM 32KX8 Microchip 24LC256.

A particular advantage of the present invention is that it does not require continuous logging and saving of data concerning battery voltage, temperature and current, which would require a large amount of on-board memory. In the present invention, the monitoring apparatus 10 implements an activity-based logging routine. This is carried out by assigning the battery three distinct states, namely: (1) open circuit, where the battery is not being charged or discharged and no current (or substantially no current) is flowing through it; (2) a charge state, wherein the battery is being charged by a charger and current is flowing through the battery (from the positive to the negative terminal); and (3) a discharge state, wherein the battery is supplying power to a load (and current is flowing through the battery in a direction from the negative to the positive terminal of the battery).

Figure 3:
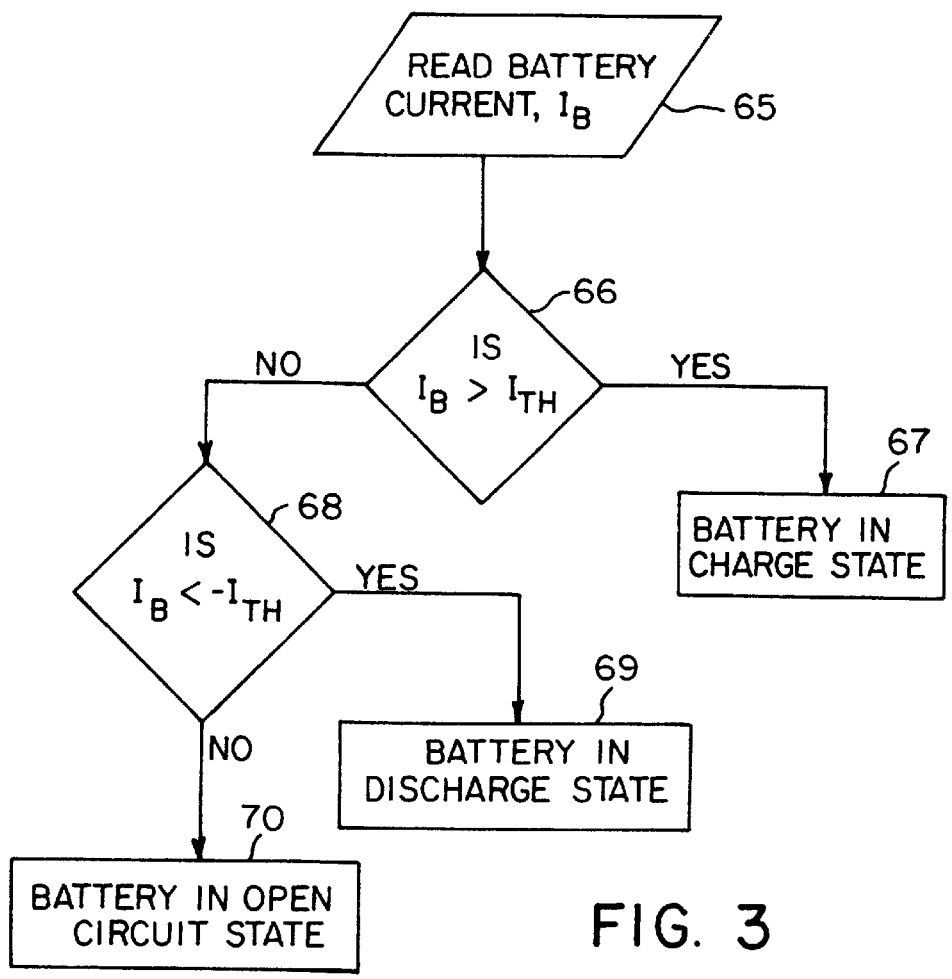
FIG. 3 is a flow chart of the process carried out by the micro-controller within the monitoring apparatus of FIG. 2 to determine the state of the battery.

In accordance with the invention, a signal corresponding to the battery current is provided on the lines 28 through the current sense input port 24 and thence through the conditioning circuit 50 and the A/D converter 42 to the micro-controller 44. The data corresponding to the current flowing through the battery is compared by the micro-controller to a selected threshold level, $I_{th}$. The micro-controller is programmed to carry out a battery current decision process as illustrated in FIG. 3. Initially, the battery current $I_b$ is read by the micro-controller at 65, and a decision is made at 66 whether $I_b$ is greater than $I_{th}$. If yes, the battery is in the charge state as noted at block 67; if no, a decision is then made at 68 whether $I_b$ is less than $-I_{th}$. If yes, the battery is in the discharge state as indicated at block 69; if no, the battery is indicated to be in the open circuit state at block 70. Thus, the battery is considered to be in an open circuit state if the current through the battery is greater than or equal to $-I_{th}$ and less than or equal to $I_{th}$. The value of $I_{th}$ is preferably selected so that it is less than the normal charge and discharge current, but not at such a low level that minor transient currents that may occur when the battery is in a quiescent state would be recorded as changes to a charge or discharge state when, in fact, charging or discharging is not occurring.

Each time the battery changes its state (e.g., from open circuit to discharge), an activity event is registered by the micro-controller 44 and a new data record is created and stored in the non-volatile memory 57. The preferred data fields that are tracked and logged (stored) during a given event, are set forth in Table 1 below.

TABLE 1

Data record for each event

| Data Field | Field Stored |
| --- | --- |
| 1 | Event Type (State)-Open Circuit, Charge, Discharge |
| 2 | Event Start Time Stamp-Year:Month:Day:Hour:Minute:Second |
| 3 | Event Total Ampere Hours |
| 4 | Event Alarms - Voltage, Current or Temperature |
| 5 | Maximum Event Voltage |
| 6 | Maximum Event Voltage Time Stamp-Y:M:D:HH:MM:SS |
| 7 | Minimum Event Voltage |
| 8 | Minimum Event Voltage Time Stamp-Y:M:D:HH:MM:SS |
| 9 | Maximum Event Temperature |
| 10 | Maximum Event Temperature Time Stamp-Y:M:D:HH:MM:SS |
| 11 | Maximum Event Current |
| 12 | Maximum Event Current Time Stamp-Y:M:D:HH:MM:SS |

Table 1 illustrates the preferred selected data fields to be saved, which comprise only 12 required fields. Consequently, each record characterizing an event that is stored in the non-volatile memory 57 consists of only 12 data fields, with each data field comprising one or two memory bytes. Although the events may last for hours, only one data field record is saved per event, greatly minimizing the memory requirements for the non-volatile memory 57 while preserving the quality and relevance of the data that is saved.

In addition to the event data records, a stationary set of finite data fields is preferably saved and updated in the non-volatile memory 57 during events. The preferred stationary data fields are listed in Table 2 below. It is noted that these fields need be created only once and updated during events.

TABLE 2

Stationary data fields

| Data Field | Field Stored |
| --- | --- |
| 1 | Installation Time-Y:M:D:HH:MM:SS |
| 2 | High Voltage Setpoint |
| 3 | Low Voltage Setpoint |
| 4 | High Current Setpoint |
| 5 | High Temperature Setpoint |
| 6 | Battery Nominal Capacity-Ampere Hours |
| 7 | Battery Nominal Voltage |
| 8 | Cycle Counter |
| 9 | Total hours of open circuit over all events |
| 10 | Total hours of discharge over all events |
| 11 | Total hours of charge over all events |
| 12 | Total Amp Hours of discharge over all events |
| 13 | Total Amp Hours of charge over all events |
| 14 | Event Counter-Counts number of events recorded |

The monitoring apparatus 10 maintains a high sampling rate of data from the voltage, current and temperature sensors so that significant transient events (e.g., maximum voltage) are captured. At each sampling point, the monitoring apparatus reads the battery voltage, current, and temperature and updates the relevant fields. The following summarizes the actions of the monitoring apparatus under control of the micro-controller during this process.

First, the monitoring apparatus continually monitors the battery current to determine if the state of the battery has changed using the process illustrated in FIG. 3. Second, if the battery state changes, a new event is recognized. Third, at the onset of a new event, the monitoring apparatus creates a new data record, increments the event counter, and saves the start time of the event. Fourth, at each sampling instant, the monitoring apparatus reads the voltage, current, and temperature variables and updates several fields, as follows:

If the voltage reading is higher than the Maximum Event Voltage field, the Maximum Event Voltage filed is updated with the new voltage reading. Otherwise, the field is unchanged. If the field is updated, the Maximum Event Voltage Time Stamp is also updated.

If the voltage reading is lower than the Minimum Event Voltage field, the Minimum Event Voltage field is updated with the new voltage reading. Otherwise, the field is unchanged.

If the current reading is higher than the Maximum Event Current field, the Maximum Event Current field is updated with the new current reading. Otherwise, the field is unchanged.

If the temperature reading is higher than the Maximum Event temperature field, the Maximum Temperature Current field is updated with the new current reading. Otherwise, the field is unchanged.

Fifth, the ampere-hour field (current over time) is updated by summing the measured amperes over time. Sixth, the alarm field is updated if the battery voltage, current, or temperature exceed preset selected levels. These levels are pre-programmed into the micro-controller 44 as part of the stationary fields listed above in Table 2. If the actual readings exceed the pre-programmed values, an alarm is generated and the alarm field is updated.

Figure 4:
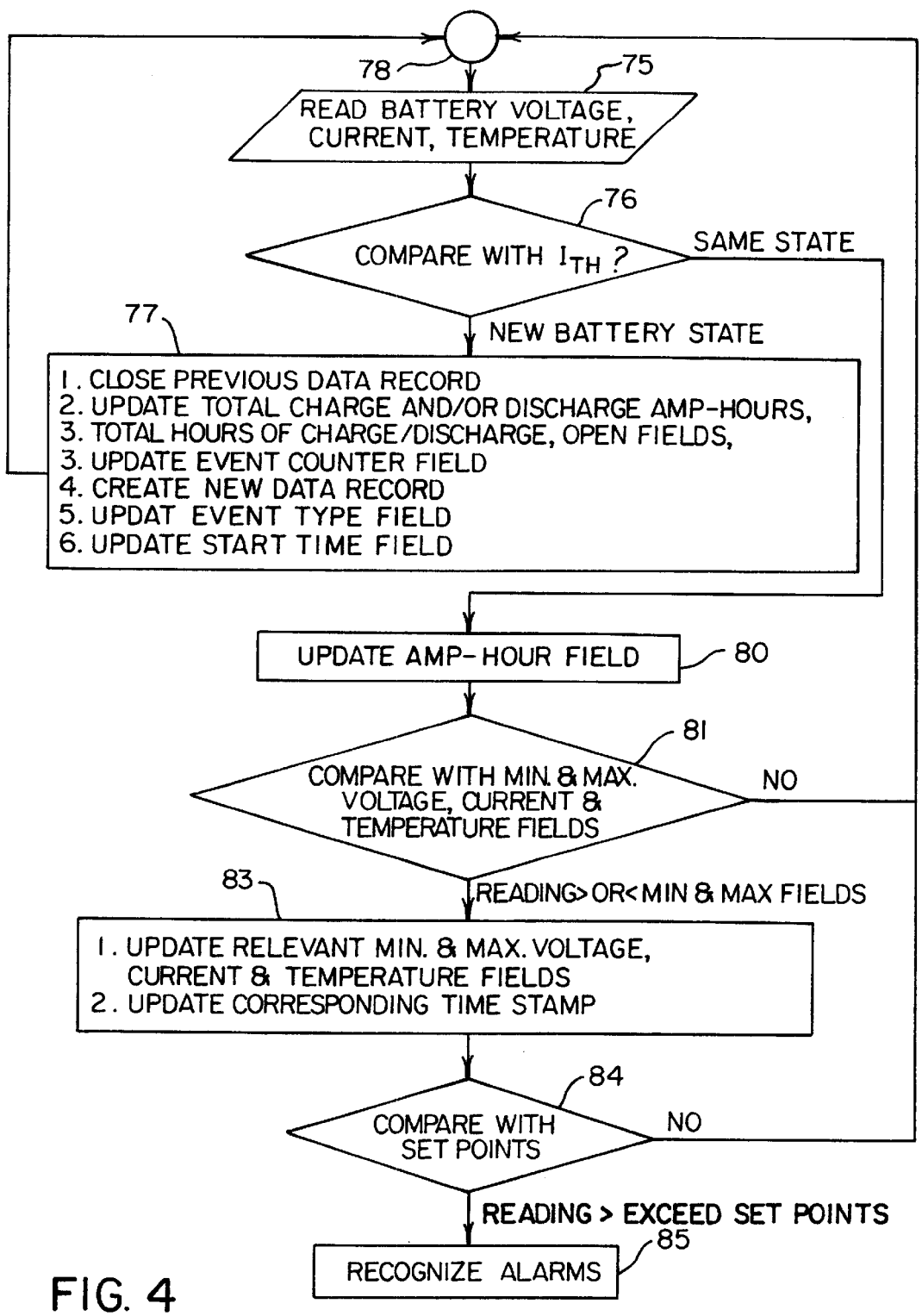
FIG. 4 is a flow chart illustrating the process carried out by the battery monitoring apparatus of the invention for determining and storing data concerning battery events.

The process carried out by the micro-controller that is summarized above is illustrated in the flow diagram of FIG. 4. The program initiates at 75 by reading the battery voltage, current, and temperature. The battery current is compared with $I_{th}$ at 76, and if a new battery state is detected, several actions are carried out as indicated in block 77, including closing the previous data record, updating the total charge and/or discharge amp-hours, total hours of charge/discharge, and open fields, updating the event counter field, creating a new data record, updating the event type field, and updating the start-time field. The program then returns back to a junction 78 and proceeds to block 75 to again the read the battery voltage, current and temperature. If the same state is determined at 76, the amp-hour field is updated at 80, and a comparison of the sampled information is made with minimum and maximum voltage, current and temperature fields at 81. If the new data do not exceed the minimums and maximums, the program continues by returning back to the junction 78 and then proceeds to again read battery voltage, current and temperature at 75. If the comparison indicates that minimum or maximum values are exceeded at 81, the program proceeds to block 83 to update the relevant minimum and maximum voltage, current and temperature fields, and to update the corresponding time stamp, and then continues on to block 84 to compare these readings with setpoints. If the readings do not exceed the setpoints, the program returns to the junction 78 and again reads battery voltage, current and temperature at 75. If the comparison at 84 indicates the setpoints have been exceeded, the program proceeds to recognize alarms at block 85.

The data fields that are summarized above are generally more than adequate to meet the requirements of an industrial battery user. Generally, industrial battery users are not concerned with the state of the battery at every instant in time, but rather are concerned with aggregate performance data during battery activities in addition to any alarms or faults that may occur.

As noted above, an advantage of the present invention is a minimization of memory requirements. For example, the non-volatile memory 57 may be formed of two 32K×8 EEPROMs, comprising 64K of memory, which allows storage of up to 1362 distinct events. If the battery experiences four events per day, this data storage is sufficient to provide 340 days of storage or nearly a year. Even if the battery experiences 20 events per day, a relatively high activity rate for a normal battery, this still provides 68 days of data storage.

Another advantage of the invention is that each record provides a detailed characterization of the battery activity during an event. The maximum and minimum battery voltages are provided along with a time stamp for them, and the maximum current and temperature are also provided with their respective time stamps. The total amp-hours during the event is recorded and stored, as well as the overall charge and discharge amp-hours over all events, which is generally the best indication of battery activity. The event amp-hour value is similar to trip miles in an automobile, as it gives users an indication of how much energy was supplied to or from the battery. The total amp-hour value of charge and discharge is similar to an automobile mileage counter and allows users to plan maintenance schedules based on amp-hour usage. Finally, alarms and faults are tracked and recorded, allowing users to identify and track abnormal conditions.

Additional advantages include easy access to data through, e.g., an RS-232 interface or an infrared device such as a Palm Pilot™. The saved data is easy to analyze and interpret. Further, the monitoring apparatus allows manufacturers to condition battery warranties on the total amp-hours of charge or discharge over the battery life span, rather than simply using a set number of months or years for the term of the warranty. This is a preferred way in which to manage warranties because it relies on actual energy usage and reflects real battery activity. Battery leasing companies can also lease battery systems and bill users based on energy usage (amp-hours) rather than only on time. Time-based leasing and billing does not appropriately compensate leasing companies where the battery is over used and over burdened.

The present invention may also be utilized with a current sensor that is capable of measuring a wide range of current levels with high precision. A current shunt is often employed in conventional current sensors to measure the system current, due to the low cost and ease of installation of shunts. However, because current shunts generate low level signals (millivolt range), the current signals are normally susceptible to both differential and common mode noise. The presence of this noise generally requires additional filtering and noise rejection circuitry to adequately discern actual signal readings from the noise. When an A/D converter is employed to convert an analog current reading into digital data to interface with a micro-controller, the attainable current reading precision depends on the number of bits used. For example, if a 10 bit A/D is employed to measure a 500 A maximum current, the reading resolution is only 0.5 A. A higher bit A/D can be employed to attain higher resolution. However, the cost of A/Ds increases with the number of bits. A 0.5 A resolution is quite acceptable during normal charge and discharge cycles, but in many battery applications, and during float charge modes, the current level can be quite low, normally a few hundred milliamps. Thus, the current reading precision needs to be quite high to accurately measure float current levels, preferably less than 10 mA. Even if a 12 bit A/D is employed, the current reading precision will only be 100 mA. This is not enough to accurately measure the float current level.

Figure 5:
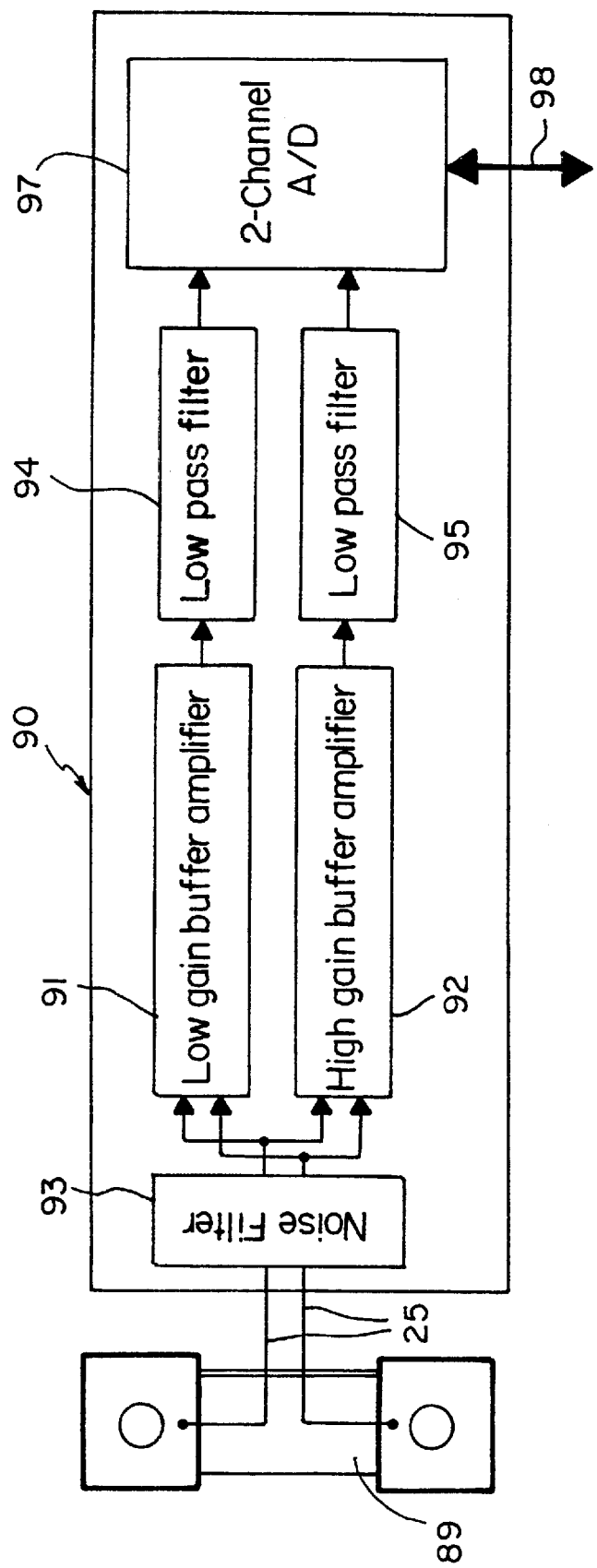
FIG. 5 is a block diagram of a current sensor for utilization in the present invention.

The present invention may be carried out utilizing a low cost, wide range, and high precision current sensor circuit. As shown in FIG. 5, a shunt 89 is connected by leads 25 to a current sensor circuit 90 that includes two current amplifier buffer circuits 91 and 92, one with low gain and the other with high gain. A noise filter 93 filters out noise from the signal transmitted from the shunt to the amplifiers 91 and 92. Low pass filtering stages 94 and 95 are used to filter out the current readings and provide a level of noise immunity. The two analog readings are then processed by a two-channel A/D 97 which supplies digital data to the monitoring apparatus 10 on data lines 98, which may be connected to the data lines 43 in the apparatus 10. The monitoring apparatus 10 selects among the two digital readouts from the AD 97 based on the current level. In this arrangement, the current sense and conditioning circuitry 50 is not required, and the A/D converter 42 is bypassed for the current sense data signals. Although the current sensor circuit 90 may be physically packaged with the other circuitry of FIG. 2, it is preferably located close to the shunt 89 as discussed further below. In this case, digital data is provided to the current sense input port 24 rather than analog signal data. It is understood that the input ports may comprise standard connectors or may simply be openings to admit the signal lines to the enclosure for the battery monitoring apparatus 10.

At high current levels, the readout of the low gain stage 91 is selected and the full range of A/D converter bits is dedicated to the full-scale current range of the system. Once the current reading drops below a low threshold level, $I_{TH\_LOW}$, the readout of the high gain stage 92 is selected. In this case, the full range of the A/D converter bits is dedicated to a narrower current range with a maximum value of $I_{TH\_LOW}$, thus increasing the precision of low current readouts.

As an example, consider a 500 A/50 mV shunt 89, i.e., the shunt 89 will produce 50 mV at 500 A. If the low gain buffer amplifier stage 91 has a gain of 82, the amplified analog current level will be 4.1V, which would represent the maximum allowable A/D 97 input voltage level. Assuming a 10 bit A/D 97 is used, this will yield a current accuracy reading of 0.5 A, which is adequate if the current level is above a few amps. This is normally the case during charge and discharge events. If a float charge current needs to be measured with an accuracy of 10 mA, the A/D bits would need to read in 10 mA increments. Since a 10 bit A/D has 1024 counts, the maximum current that can be measured will be 10.24 A. As a result, the low threshold current level, $I_{THLOWS}$, is preferably set at 10 A. At 10 A, the shunt 89 would product 1 mV. As a result, the high gain buffer amplifier stage 92 would need to have a gain of 4100 to yield the maximum allowable A/D input voltage level of 4.1V. If the current reading is higher than 10 A, the monitor 10 selects channel 1 (low gain) of the A/D with a reading precision of 0.5 A. Once the current reading drops below 10 A, the monitor 10 selects channel 2 (high gain) of the A/D with a reading precision of 10 mA. At current levels above 10 A, the high gain amplifier 92 would merely saturate.

Due to the low voltage signal level generated by the shunt (millivolts), all readings are highly susceptible to common mode and differential mode noises. Consequently, it is desirable to reduce the noise levels and provide a high quality input signal level.

To minimize the noise levels and reduce any noise interference, the current sense and conditioning circuitry 91 and 92 along with the A/D converter 97 are preferably placed on a current sense printed circuit board (PCB) 100 that may be positioned in close proximity to the shunt 89, as illustrated in FIGS. 6 and 7. Instead of sending analog signals to the monitor 10, the A/D conversion occurs on the current sense PCB 100, which preferably receives the voltage across the shunt at input terminals 102 which are connected by a short twisted pair of leads 25 to the shunt 89, and digital signals are sent on the data lines 98 to the monitor 10, greatly improving the quality of the current readout and minimizing noise levels.

Figure 8:
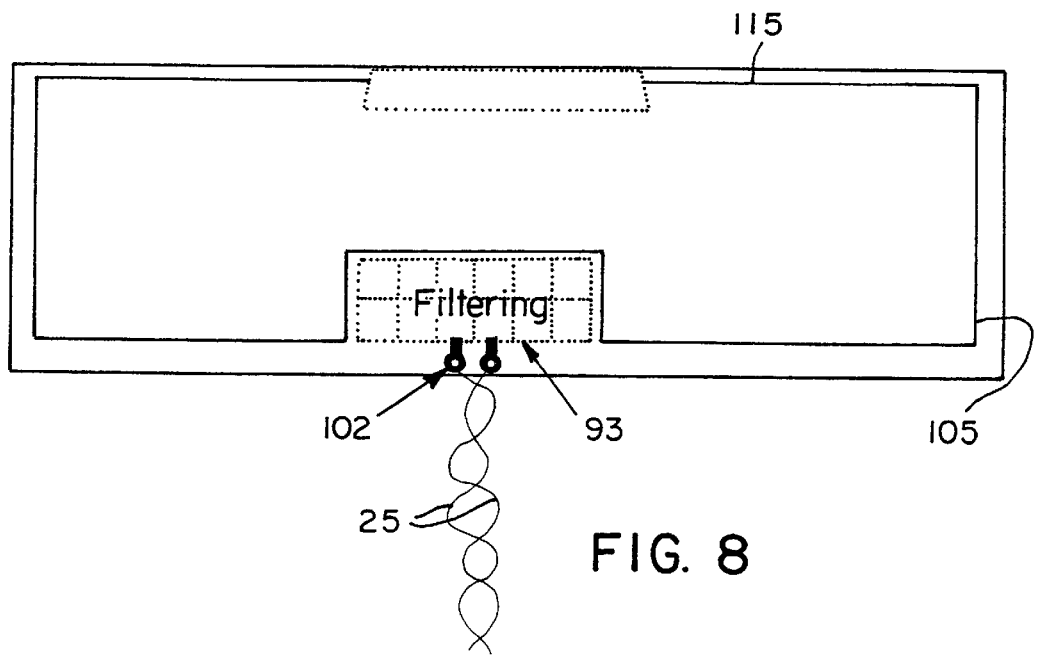
FIG. 8 is a top view of the circuit board of the current sensor of FIG. 7.
Figure 9:
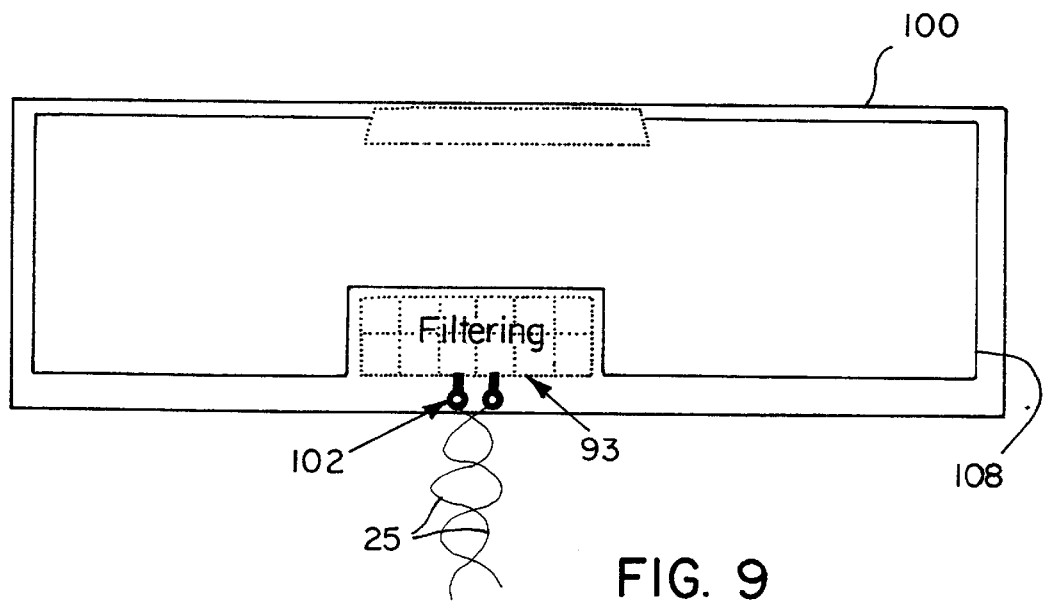
FIG. 9 is a bottom view of the circuit board of the current sensor of FIG. 7.
Figure 10:
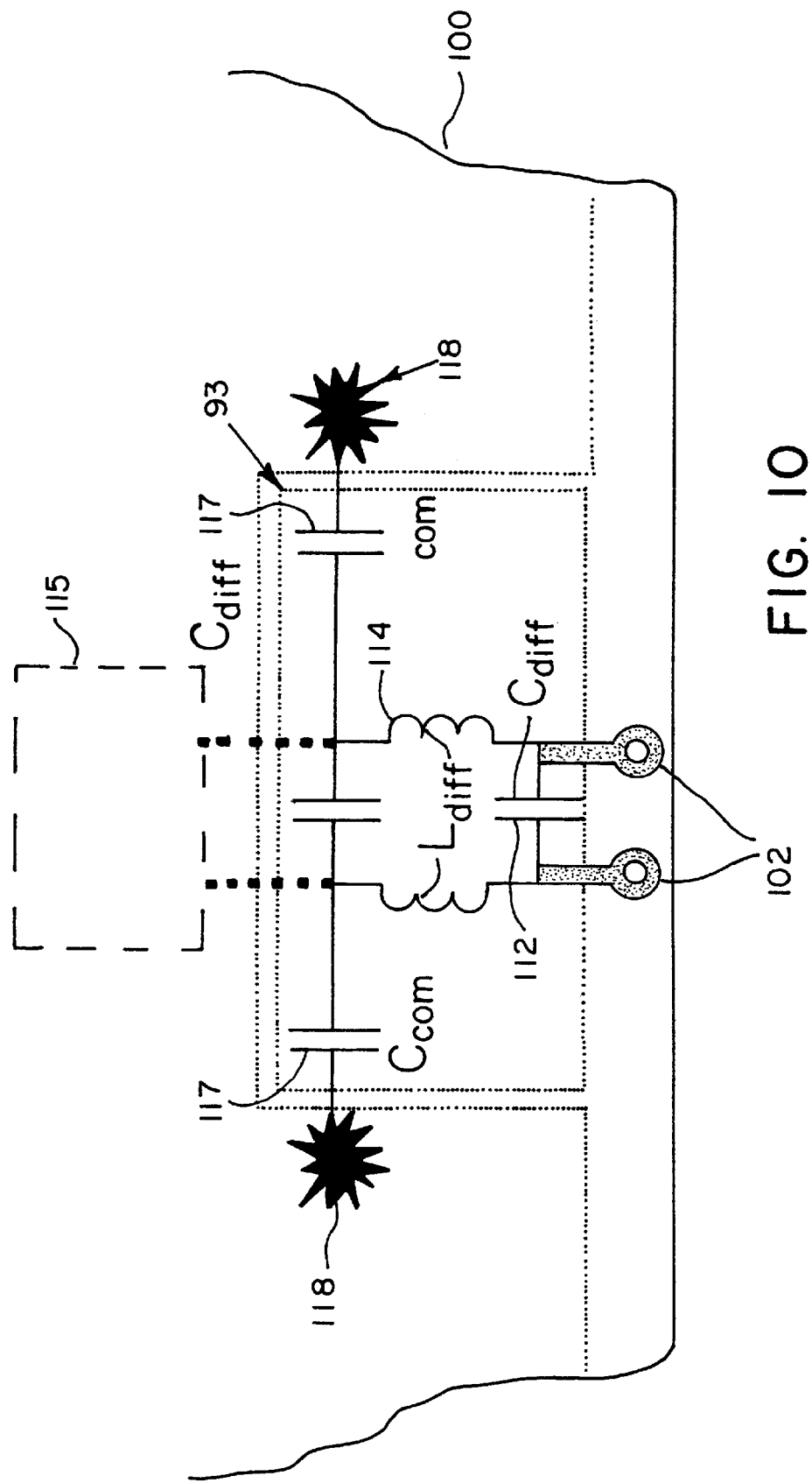
FIG. 10 is a circuit diagram illustrating the effective layout and placement of the filter network in the current sensor of FIG. 7.

The layout of the current sense PCB 100 is important to reducing noise interference and improving the accuracy of the current measurement. A layout that is substantially noise immune is shown in FIGS. 8–10. The board 100 has a top layer 105 and a bottom layer 108 as shown in FIGS. 8 and 9, respectively. The lines 25 carrying the current sense signal are connected via the input terminals 102 to the noise filter 93 which is composed first of a differential mode capacitor 112, followed by a differential and common mode filter 114. The rest of the analog and digital circuit components 115 are placed in the component section on the top layer 105. The bottom layer 108 preferably includes a ground plane except under the filter circuitry 100, to minimize noise. The common mode filter capacitors 117 are connected directly to the ground plane at connections 118 as the filtered signal enters the processing circuitry. Close and compact placement of the various circuit components is preferred so as to reduce noise and improve circuit noise immunity.

It is understood that the invention is not confined to the embodiments set forth herein as illustrative, but embraces all forms thereof as come within the scope of the following claims.

What is claimed is:

1. A battery monitoring apparatus comprising:
    (a) a voltage sense input port to which leads extending to a battery may be connected such that a signal representing the voltage across the battery is provided to the voltage sense input port;
    (b) a current sense input port to which leads extending to a current sensor may be connected such that a signal representing the current through the battery is provided to the current sense input port;
    (c) an output communications port through which data may be communicated;
    (d) a non-volatile memory; and
    (e) a programmable microcontroller connected to the voltage sense and current sense input ports to receive signals therefrom and connected to the output communications port to at least transmit signals thereto, the microcontroller connected to provide data to and from the non-volatile memory, the microcontroller programmed to monitor the signal from the current sense port to detect a change in battery state from one of the states of battery charging, discharging, and open circuit to another state, and to define a battery event between changes of state, to monitor the battery voltage and current during each event, to store data to the non-volatile memory after an event including at least the time and state of the event and the total current over time as supplied from or to the battery during the event, and to selectively transfer data from the non-volatile memory through the output communications port after a period of time in which events have occurred.

2. The battery monitoring apparatus of claim 1 further including a temperature sense input port, the microcontroller connected to the temperature sense input port to receive a signal therefrom during a battery event and to store data to the non-volatile memory after an event corresponding to one or more of the maximum battery temperature and minimum battery temperature occurring during the event.

3. The battery monitoring apparatus of claim 1 wherein the output port includes at least a digital communications port.

4. The battery monitoring apparatus of claim 1 wherein the output port includes an infrared communications device.

5. The battery monitoring apparatus of claim 1 wherein the voltage sense and current sense input ports are analog signal ports, and further including an analog to digital converter connected between each of the input ports and the microcontroller to convert the analog data at the input ports to digital data supplied to the microcontroller.

6. The battery monitoring apparatus of claim 1 further including a current sensor connected in series with the battery to detect the level and direction of current flowing through the battery, the current sensor including an analog to digital converter to convert the signal corresponding to battery current level and direction to a digital data signal which is connected by a digital data communications link to the current sense input port.

7. The battery monitoring apparatus of claim 6 wherein the current sensor further includes a shunt of a known resistance through which flows the current flowing through the battery, an amplifier connected to receive the voltage across the shunt, a filter to low-pass filter the signal from the amplifier, the analog to digital converter connected to receive the filtered output signal from the amplifier and providing a digital output data on the digital data communications link to the current sense input port.

8. The battery monitoring apparatus of claim 7 wherein the current sensor includes a high gain amplifier and a low gain amplifier, each amplifier connected to receive the voltage across the shunt, wherein the analog to digital converter includes a first channel connected to receive a filtered output from the high gain amplifier and a second channel connected to receive a filtered output from the low gain amplifier, the digital output signals of the analog to digital converter channels connected via the digital data communications link to the current sense input port, the microcontroller programmed to selectively receive the current sense data from the first analog to digital converter channel when the current being sensed is below a threshold value and from the second analog to digital converter channel when the current being sensed is above a threshold value.

9. The battery monitoring apparatus of claim 8 wherein the high gain amplifier saturates at a selected current level and the microcontroller is programmed to select data from the second analog to digital converter channel when the data from the first analog to digital converter channel is at the saturation level of the signal from the high gain amplifier.

10. The battery monitoring apparatus of claim 1 wherein the microcontroller is programmed to store one or more data fields for each battery event to the non-volatile memory selected from the group consisting of total event ampere hours, voltage, current or temperature event alarms, maximum event voltage, maximum event voltage time occurrence, minimum event voltage, minimum event voltage time occurrence, maximum event temperature, maximum event temperature time occurrence, maximum event current, and maximum event current time occurrence.

11. The battery monitoring apparatus of claim 10 wherein the microcontroller is programmed to store all of the data fields in the group of data fields to the non-volatile memory for each event.

12. The battery monitoring apparatus of claim 1 wherein the microcontroller is programmed to store one or more stationary data fields in the non-volatile memory selected from the group consisting of installation time, high voltage setpoint, low voltage setpoint, high current setpoint, high temperature setpoint, battery nominal capacity in ampere hours, battery nominal voltage, a cycle counter, total hours of open circuit overall events, total hours of discharge overall events, total hours of charge overall events, total amp-hours of discharge overall events, total amp-hours of charge overall events, and a count of the number of events recorded.

13. The battery monitoring apparatus of claim 1 2 wherein the microcontroller is programmed to store all of the stationary data fields from the group of stationary data fields.

14. The battery monitoring apparatus of claim 6 wherein the current sensor components are mounted on a printed circuit board connected to the shunt, the printed circuit board having a ground plane formed on a first side of the board, and current sense tracks printed on an opposite side of the board which extend from terminals connected to the shunt to a filter, the filter connected to provide a filtered signal to the amplifier and analog to digital converter on the printed circuit board.

15. A method of monitoring the condition of a battery over time comprising:
(a) monitoring the current to or from the battery to detect the change in battery state from one of the states of battery charging, discharging, and open circuit to another state, and defining a battery event between changes of state; and
(b) monitoring the battery voltage and current during each event and, after each event, storing data to a non-volatile memory which includes at least the time and state of the event and the total current over time as supplied from or to the battery during the event.

16. The method of claim 15 further including selectively transferring data from the non-volatile memory after a period of time in which events have occurred over a communications link to a computer.

17. The method of claim 15 further including monitoring the temperature of the battery and storing data to a non-volatile memory after an event which corresponds to one or more of the maximum battery temperature and minimum battery temperature occurring during the event.

18. The method of claim 15 further including storing one or more data fields for each battery event to the non-volatile memory from the group consisting of total event ampere hours, voltage, current or temperature event alarms, maximum event voltage, maximum event voltage time occurrence, minimum event voltage, minimum event voltage time occurrence, maximum event temperature, maximum event temperature time occurrence, maximum event current, and maximum event current time occurrence.

19. The method of claim 15 further including storing one or more stationary data fields in the non-volatile memory selected from the group consisting of installation time, high voltage setpoint, low voltage setpoint, high current setpoint, high temperature setpoint, battery nominal capacity and ampere hours, battery nominal voltage, a cycle counter, total hours of open circuit overall events, total hours of discharge overall events, total hours of charge overall events, total amp-hours of discharge overall events, total amp-hours of charge overall events, and a count of the number of events recorded.

20. A current sensor that may be connected to detect the level and direction of current flowing in a circuit such as through a battery, comprising:
(a) a shunt of a known resistance which may be connected to have current flow therethrough;

(b) a high gain amplifier and a low gain amplifier, each amplifier connected to receive the voltage across the shunt; and (c) an analog to digital converter having a first channel connected to receive an output from the high gain amplifier and a second channel connected to receive an output from the low gain amplifier, digital output signals of the analog to digital converter channels available for connection to a digital data communications link.

21. The current sensor of claim 20 wherein the high gain amplifier saturates at a selected current level.

22. The current sensor of claim 20 further including a noise filter connected between the shunt and the low and high gain amplifiers to filter out differential and common mode noise.

23. The current sensor of claim 20 further including a low pass filter connected between each of the high and low gain amplifiers and the analog to digital converter.

* * * * *